United States Patent [19]
Kudo et al.

[11] Patent Number: 5,495,115
[45] Date of Patent: Feb. 27, 1996

[54] SEMICONDUCTOR CRYSTALLINE LAMINATE STRUCTURE, FORMING METHOD OF THE SAME, AND SEMICONDUCTOR DEVICE EMPLOYING THE SAME

[75] Inventors: Makoto Kudo, Hachiouji; Tomoyoshi Mishima, Shiki; Takuma Tanimoto; Misuzu Sagawa, both of Kokubunji, all of Japan

[73] Assignee: Hitachi, Ltd., Tokyo, Japan

[21] Appl. No.: 287,276

[22] Filed: Aug. 8, 1994

[30] Foreign Application Priority Data

Aug. 6, 1993 [JP] Japan .................................. 5-195840

[51] Int. Cl.$^6$ .................. H01L 29/205; H01L 29/778
[52] U.S. Cl. ................... 257/190; 257/18; 257/20; 257/194; 257/22; 257/191; 372/45
[58] Field of Search ...................... 257/18, 20, 194, 257/191, 190, 22; 372/45

[56] References Cited

U.S. PATENT DOCUMENTS 4,984,242   1/1991   Scifres et al. ........................... 257/18

FOREIGN PATENT DOCUMENTS 61-3464    1/1986   Japan .
0171531    2/1986   Japan .................................. 257/194
2-3937     1/1990   Japan .................................. 257/194

OTHER PUBLICATIONS

*IBM TDB* vol. 36 No. 3 Mar. 1993 pp. 127–129 "Si/SiGe Heterostructure . . . SiGe Channel".
Sagawa et al *Elec. Letts* 13 Aug. 92 vol. 28 No. 17 pp. 1639–1640 "Confinement Layer . . . High Temp.".

Primary Examiner—Jerome Jackson, Jr.
Attorney, Agent, or Firm—Antonelli, Terry, Stout & Kraus

[57] ABSTRACT

A semiconductor crystalline laminate structure wherein between a first semiconductor layer consisting of a first alloyed semiconductor and a second semiconductor layer which has an energy gap wider than that of the first alloyed semiconductor and a lattice constant smaller than that of the first alloyed semiconductor and consists of one semiconductor selected from a group of single-element semiconductor, compound semiconductor, and alloyed semiconductor which contain no semiconductor having a largest lattice constant among the semiconductor constituting the first alloyed semiconductor, a third semiconductor layer which consists of a second alloyed semiconductor having an energy gap wider than that of the first alloyed semiconductor and contains the semiconductor having a largest lattice constant among the semiconductors constituting the first alloyed semiconductor is formed in contact with these layers, a forming method for the semiconductor crystalline laminate structure, and a semiconductor device using the method are indicated.

10 Claims, 10 Drawing Sheets

SEMICONDUCTOR CRYSTALLINE LAMINATE STRUCTURE, FORMING METHOD OF THE SAME, AND SEMICONDUCTOR DEVICE EMPLOYING THE SAME

BACKGROUND OF THE INVENTION

The present invention relates to a semiconductor crystalline laminate produced by epitaxial growth, a forming method thereof, and a semiconductor device consisting of an electronic device, optical device and so on using the semiconductor crystalline laminate.

A semiconductor device of electronic elements or optical elements using a semiconductor crystalline laminate structure of hetero structure consisting of semiconductor layers containing In and semiconductor layers containing no In which is epitaxially grown by the molecular beam epitaxy (MBE) method or the metal organic chemical vapor deposition method is known.

An HEMT (high electron mobility transistor) having a selectively doped hetero structure of a compound semiconductor using an InGaAs strained layer as a channel and an AlGaAs layer as a spacer is indicated as an electronic device in Japanese Patent Application Laid-Open No. 61-3464.

A quantum well semiconductor laser using an InGaAs layer as a quantum well layer and an AlGaAs layer as a barrier layer is indicated as an optical device in Electronics Letters Vol. 28 (1992), pp. 1639–1640.

SUMMARY OF THE INVENTION

The semiconductor crystalline laminate structure of the above prior art has problems such that the electric property such as mobility and sheet carrier density and the reproducibility of the peak wave length of an emission spectrum are bad, and horizontal distribution of the values thereof is not uniform in each wafer, and characteristics specified by designed values cannot be obtained.

An object of the present invention is to provide a semiconductor crystalline laminate structure wherein the reproducibility of the aforementioned characteristics is good, and horizontal fluctuations thereof in each wafer are small, and the characteristics thereof are superior to the conventional ones, a forming method thereof, and a semiconductor device.

The above object can be accomplished by a semiconductor crystalline laminate structure which has a first semiconductor layer consisting of a first alloyed semiconductor, a second semiconductor layer which has an energy gap wider than that of the first alloyed semiconductor and a lattice constant smaller than that of the first alloyed semiconductor and consists of one semiconductor selected from a group of single-element semiconductor, compound semiconductor, and alloyed semiconductor, and a third semiconductor layer which consists of a second alloyed semiconductor having an energy gap wider than that of the first alloyed semiconductor and is formed between the first semiconductor layer and the second semiconductor layer in contact with them, wherein the semiconductor having a largest lattice constant among the semiconductors constituting the first alloyed semiconductor is included only in the first semiconductor layer and the third semiconductor layer among the first, second, and third semiconductor layers. The above object can be accomplished by forming the semiconductor crystalline laminate structure in the order of the first, third, and second semiconductor layers from the substrate side or in the order of the second, third, and first semiconductor layers and the first and third semiconductor layers at a temperature between 400° C. and 450° C. Furthermore, the above object can be accomplished by a semiconductor device using it.

Concretely explaining a case that the present invention is applied to a semiconductor crystalline laminate structure having a hetero interface which consists of a semiconductor layer (InGaAs layer) containing In and a semiconductor layer (AlGaAs layer) containing no In, a forming method thereof, or a semiconductor device using it, the InGaAs layer is equivalent to the first semiconductor layer and the AlGaAs layer is equivalent to the second semiconductor layer. The semiconductor having a largest lattice constant among InAs and GaAs constituting InGaAs is InAs. Therefore, the alloyed semiconductor constituting the third semiconductor layer consists of InAs and other semiconductors. In this case, other semiconductors are selected so that the energy gap becomes wider than that of InGaAs. For example, AlAs and GaAs are selected as other semiconductors and the third semiconductor layer becomes an InAlGaAs layer.

The operation of the present invention will be explained by using an example that the present invention is applied to a semiconductor crystalline laminate structure having a hetero interface which consists of a semiconductor layer containing In and a semiconductor layer containing no In, a forming method thereof, or a semiconductor device using it.

Surface segregation of In generated during growth (lamination) of a semiconductor heterostructure may be mentioned as one of the causes for that the characteristics, reproducibility thereof, and horizontal fluctuations thereof in each wafer of the aforementioned prior art are bad. For example, when the hetero structure such as GaAs/InGaAs/GaAs grows, In among InGaAs is interchanged with Ga in the next layer at a high probability more than 60% during crystal growth at a growth temperature (substrate temperature) of more than 400° C. Therefore, even if the InGaAs layer is switched to the GaAs layer, In enters the GaAs layer which is the next layer and an abrupt hetero structure cannot be obtained. The problem of surface segregation of In also exists when the InGaAs layer is switched to the GaAs layer as described later. As a result, the interface of the hetero structure consisting of a layer containing In and a layer containing no In becomes gradual. As the growth temperature rises, the surface segregation ratio of In increases and the hetero interface is degraded.

Even when the crystal growth temperature is lowered so as to avoid the surface segregation of In, the segregation ratio is reduced little and the quality of crystal itself is degraded instead.

Figure 10:
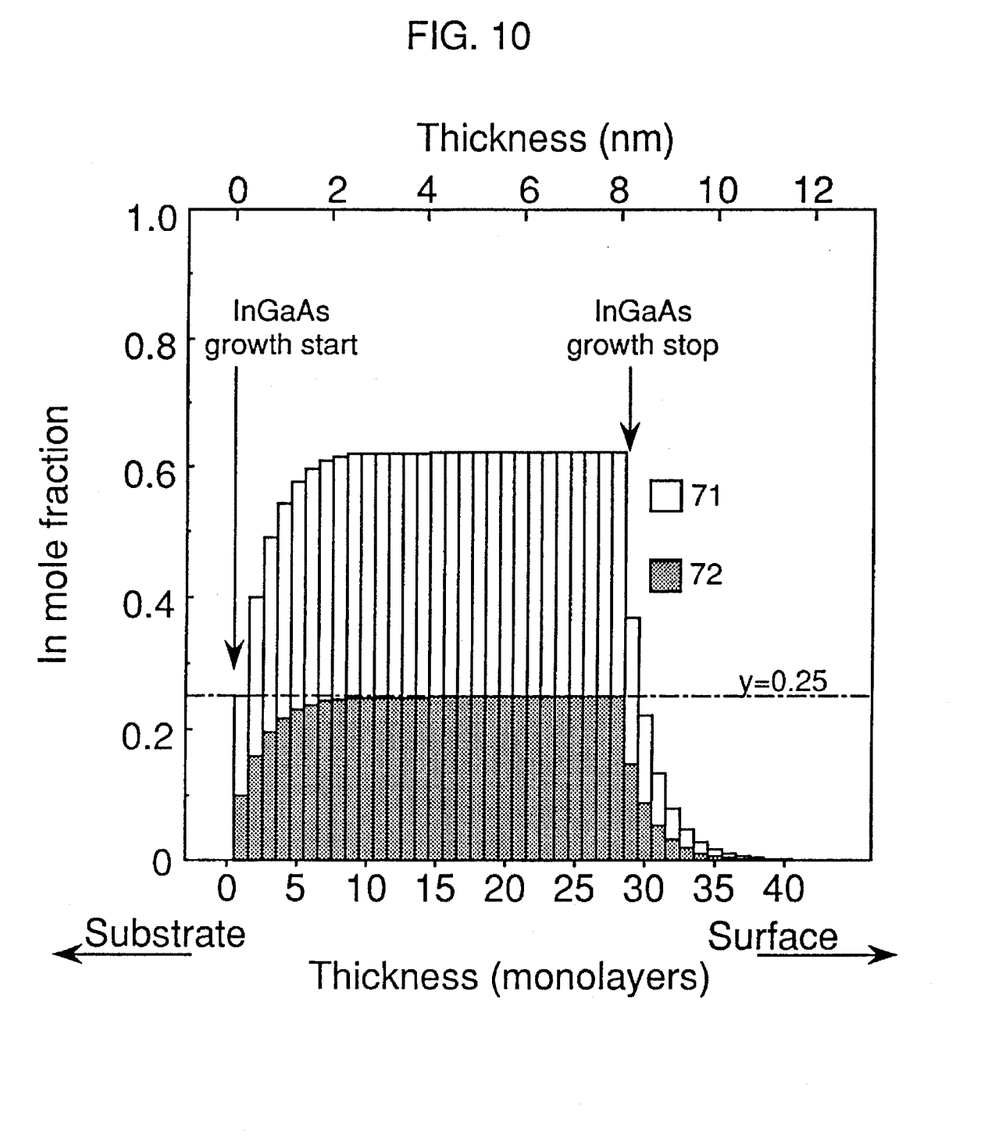
FIG. 10 is a drawing showing the state of surface segregation of In when a hetero structure consisting of GaAs/InGaAs/GaAs is formed, which is subdivided on the monolayer level.

Next, the state of segregation will be explained with reference to FIG. 10. FIG. 10 shows the state of segregation of In during growth of an InGaAs layer having an In mole fraction of 0.25 at an In segregation rate of 60%. The drawing shows that there is a large amount of In 71 on a surface, and a distribution 72 of In mole fraction in an InGaAs layer is changed stepwise in an area of about 2 nm when the InGaAs layer starts growth and accordingly the hetero interface becomes gradual, and the hetero interface becomes gradual also in an area of about 2 nm when the InGaAs layer ends growth, and the composition of In is stable at a desired value (0.25 in this case) at the intermediate stage of growth of the InGaAs layer.

Figure 2A:
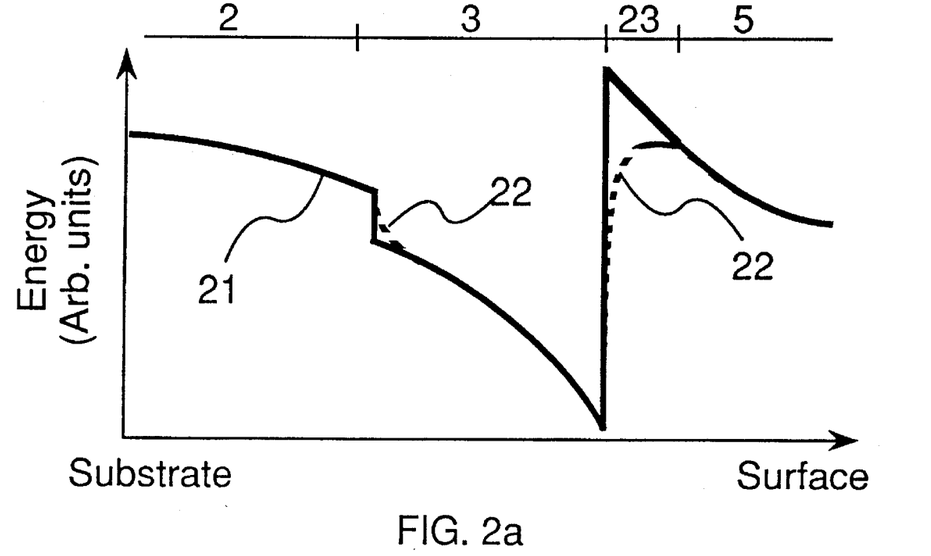
FIGS. 2a and 2b are drawings showing the energy band diagram of the conventional AlGaAs spacer/InGaAs channel selectively doped hetero structure and the In distribution respectively.
Figure 2B:
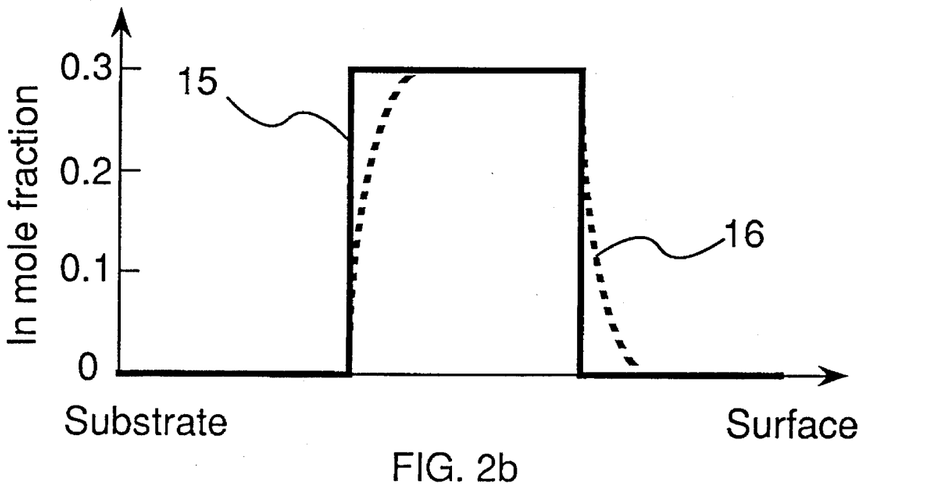

Next, the effect of this gradual hetero interface on the energy band diagram will be explained. Firstly, a case of a HEMT will be explained. In the case of a HEMT having a selectively doped hetero structure using an InGaAs layer 3 (In mole fraction 0.3) as a channel and an AlGaAs layer 23 as a barrier (spacer) as shown in FIG. 2a, the energy band diagram of the conduction band should be a solid line 21 if it is as designed as shown in FIG. 2a. Actually, however, it is gradual on the interface between the spacer 23 and the channel 3 like a dashed line 22. As shown in FIG. 2b, it is caused by that the In distribution is not shown by a solid line 15 as designed but it is gradual on the interface between the spacer 23 and the channel 3 like a dashed line 16 due to surface segregation of In.

The spacer-channel interface of selectively doped hetero structure is a most important part to decide the characteristic of HEMT. Therefore, when an abrupt spacer-channel interface is not obtained as mentioned above, the carrier confinement effect and the mobility of two-dimensional electron gases reduce and the characteristic of HEMT is degraded.

Figure 1:
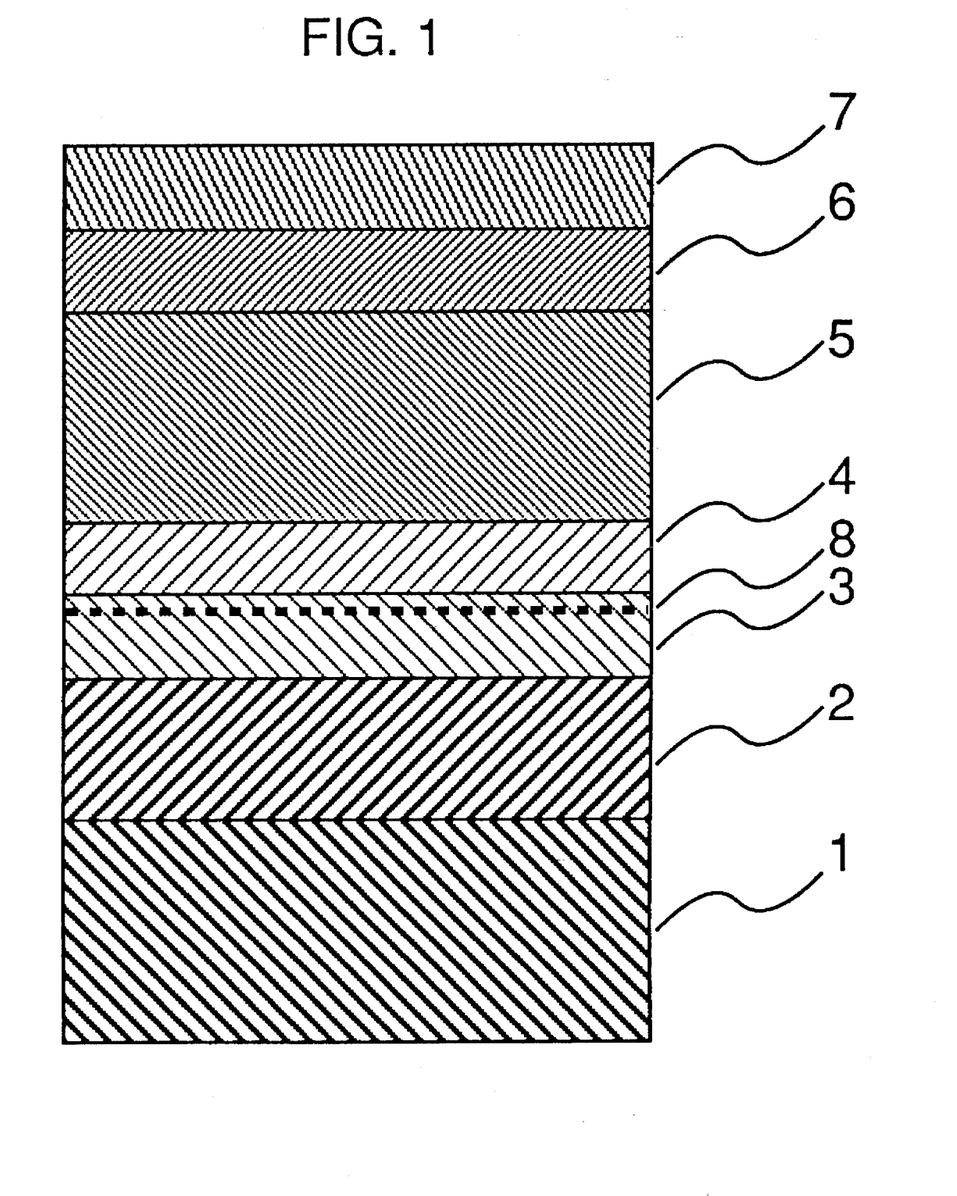
FIG. 1 is a cross sectional view of a semiconductor crystalline laminate structure having a selectively doped hetero structure of Embodiment 1 of the present invention.
Figure 4A:
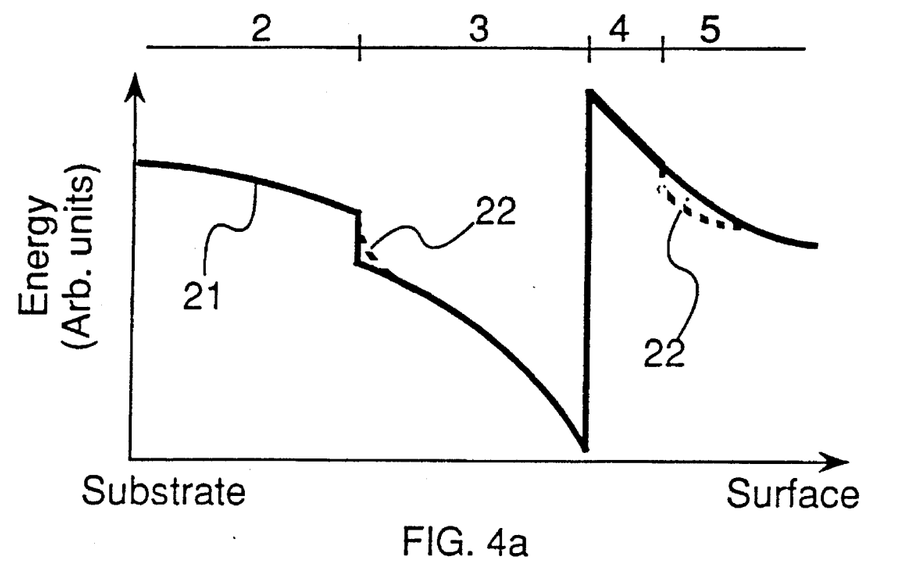
FIGS. 4a and 4b are drawings showing the energy band diagram of the semiconductor crystalline laminate structure having the selectively doped hetero structure shown in FIG. 1 and the In distribution respectively.
Figure 4B:
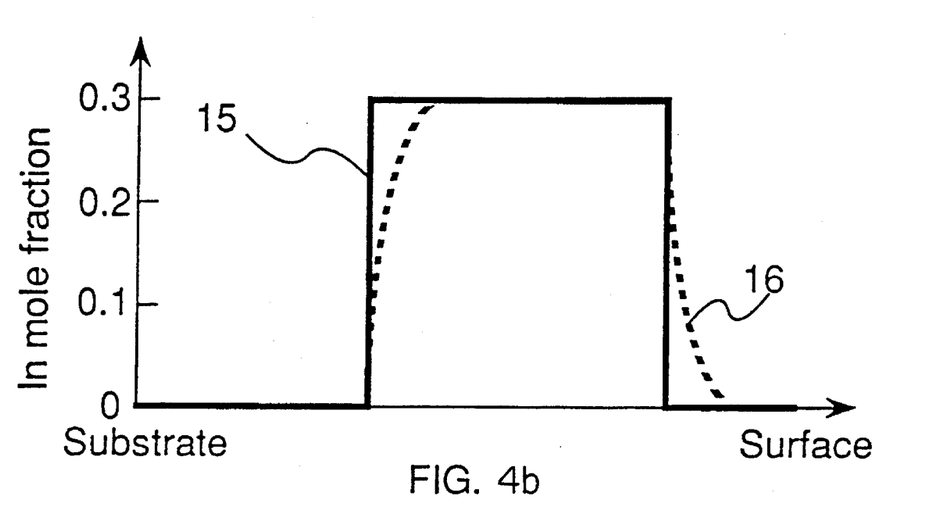
Figure 5:
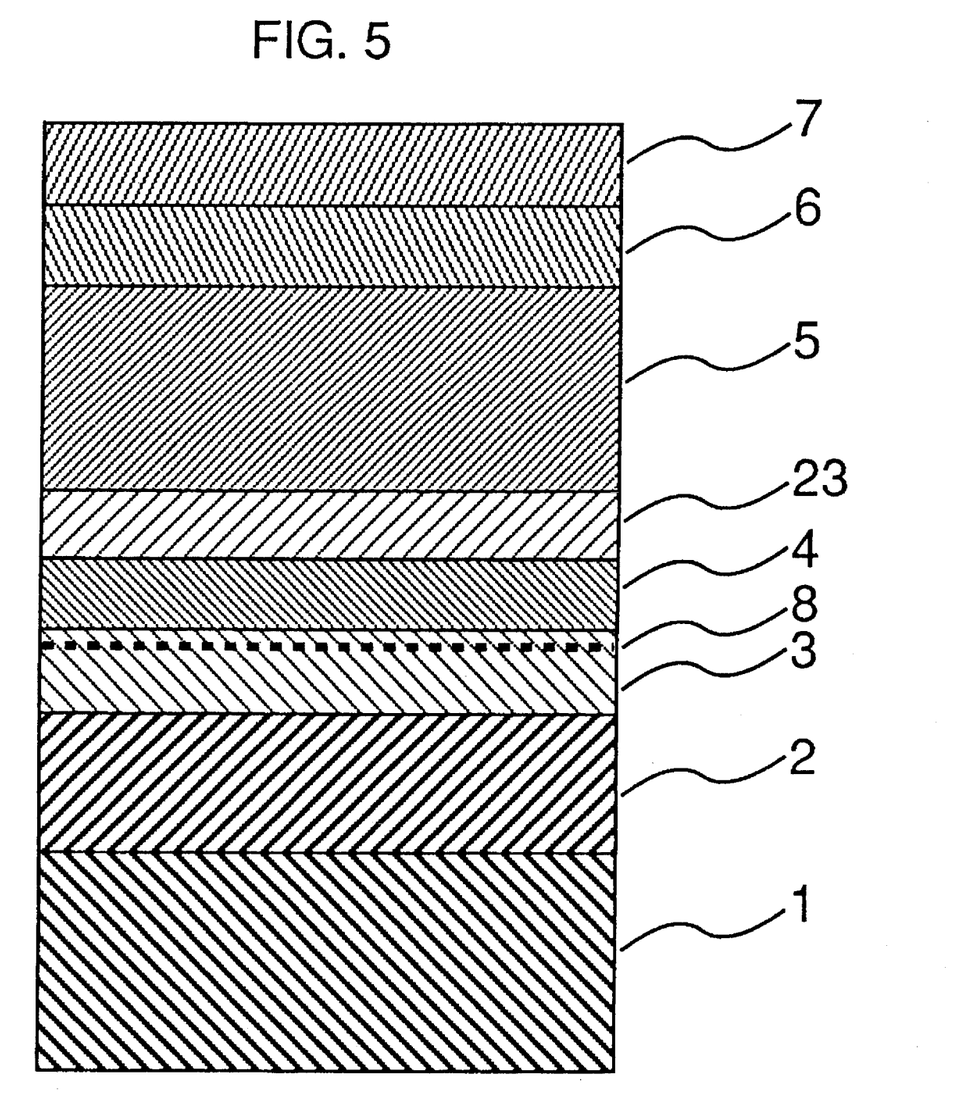
FIG. 5 is a cross sectional view of a semiconductor crystalline laminate structure having a selectively doped hetero structure of Embodiment 2 of the present invention.

To solve this problem, according to the present invention, the AlGaAs spacer (barrier) layer 23 is replaced with an InAlGaAs layer 4 as shown in FIGS. 1, 4a and 4b. Furthermore, as shown in FIG. 5, the InAlGaAs layer 4 is inserted between the InGaAs channel layer 3 and the AlGaAs spacer layer 23.

A case that the InAlGaAs layer 4 is used as a spacer (barrier) as shown in FIGS. 1, 4a and 4b will be explained typically. Since In is contained also in the spacer, the In distribution 16 is not gradual on the interface between the spacer 4 and the channel 3 interface as shown in FIG. 4b and the gradualness is moved to an n-type AlGaAs carrier supply layer 5 which is the next layer to the InAlGaAs spacer layer 4. Since the effect of In surface segregation on the spacer-channel interface can be eliminated as mentioned above, the spacer-channel interface becomes abrupt.

As to the energy band diagram of conduction band, as shown in FIG. 4a, the part corresponding to the n-type AlGaAs carrier supply layer 5 where the In distribution 16 is gradual is not shown by the solid line 21 as designed but by the dashed line 22, though the interface between the spacer 4 and the channel 3 is as designed (the symbol 21 is overlaid with the symbol 22).

Therefore, the spacer-channel interface which affects the mobility of two-dimensional electron gases generated in the channel of the selectively doped hetero structure and the sheet carrier density most greatly becomes extremely abrupt, so that the mobility of two-dimensional electron gases is improved, and the carrier confinement effect to the channel is increased, and the electric property such as transconductance of the HEMT device is improved. Furthermore, the channel property is not affected by In segregation, so that the yield of semiconductor crystalline laminate structure and the horizontal fluctuation of the channel property in each wafer are improved and consequently the device yield is improved and forming of ICs are made easy.

Figure 6:
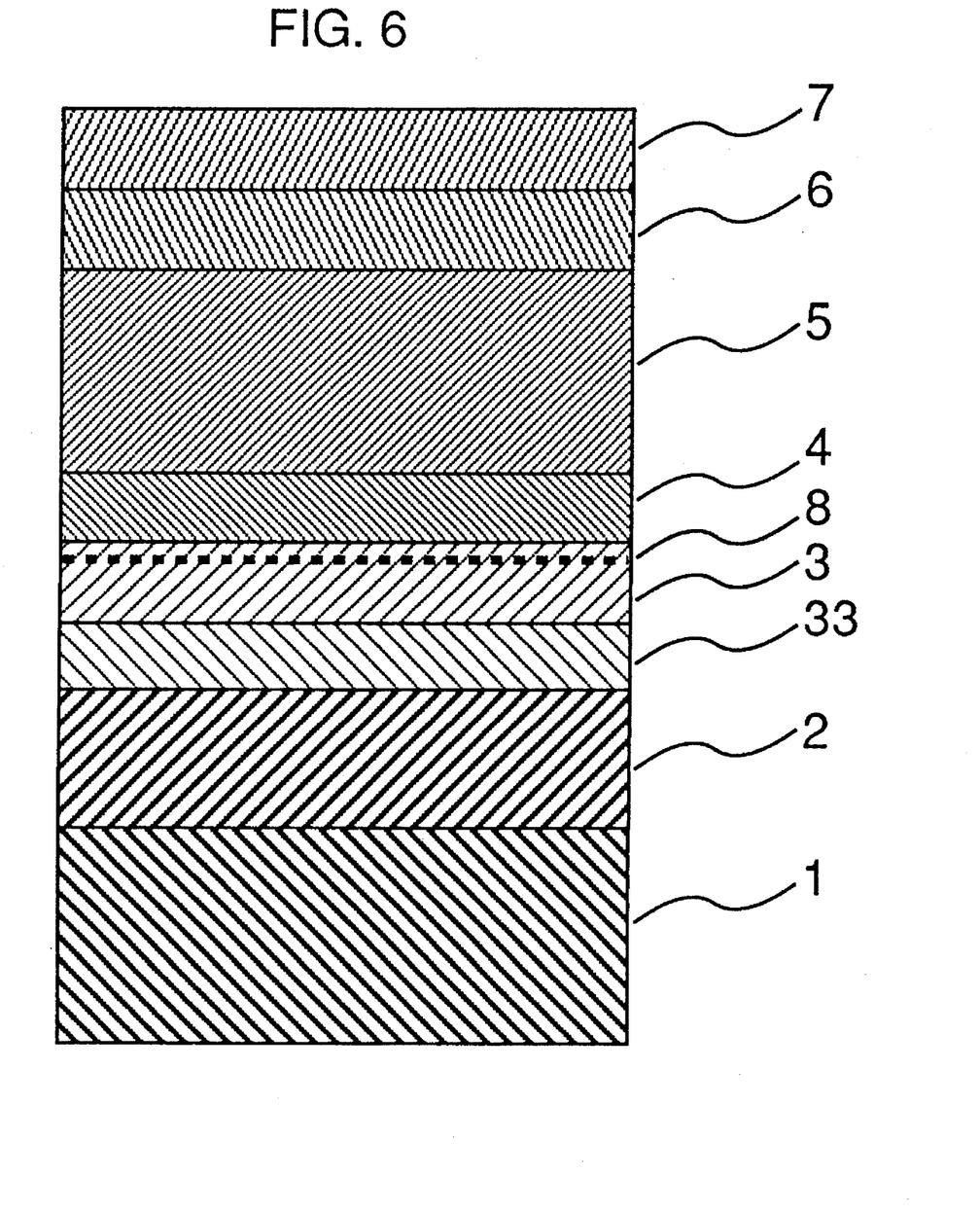
FIG. 6 is a cross sectional view of a semiconductor crystalline laminate structure having a selectively doped hetero structure of Embodiment 3 of the present invention.

The interface between the channel 3 and the buffer 2 is also gradual by the surface segregation of In. In the case of HEMT, the carrier distribution is offset to the side of spacer 23 of the channel 3, so that this gradualness is a small matter, though the carrier confinement effect to the channel 3 is reduced certainly. Therefore, as shown in FIG. 6, it is effective to insert an InAlGaAs layer 33 into the interface between the channel 3 and the buffer 2 as a buffer layer.

Figure 3A:
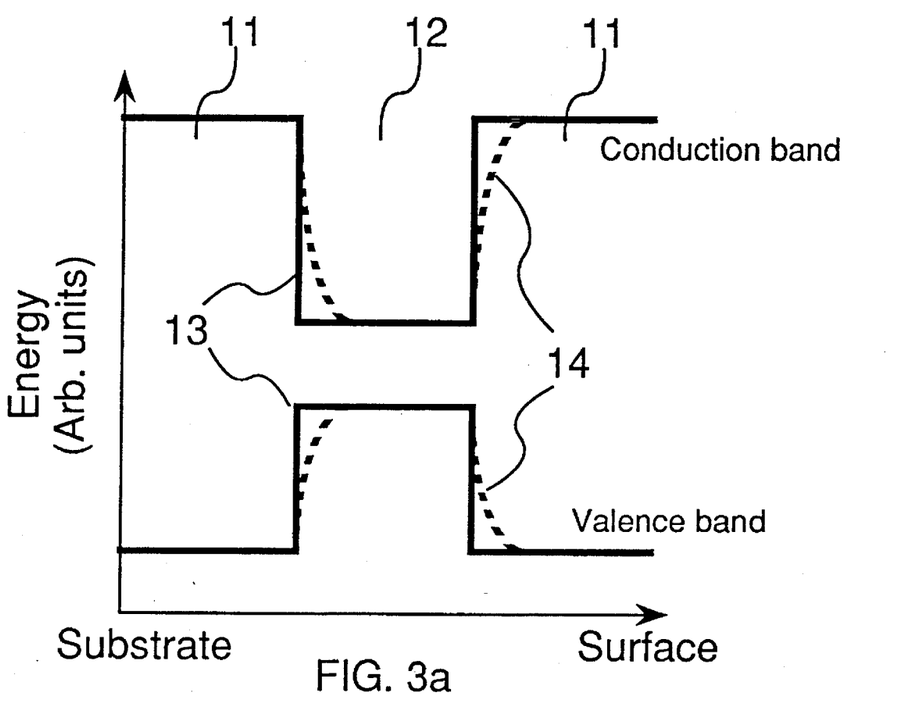
FIGS. 3a and 3b are drawings showing the energy band diagram of the conventional GaAs/InGaAs/GaAs quantum well structure and the In distribution respectively.
Figure 3B:
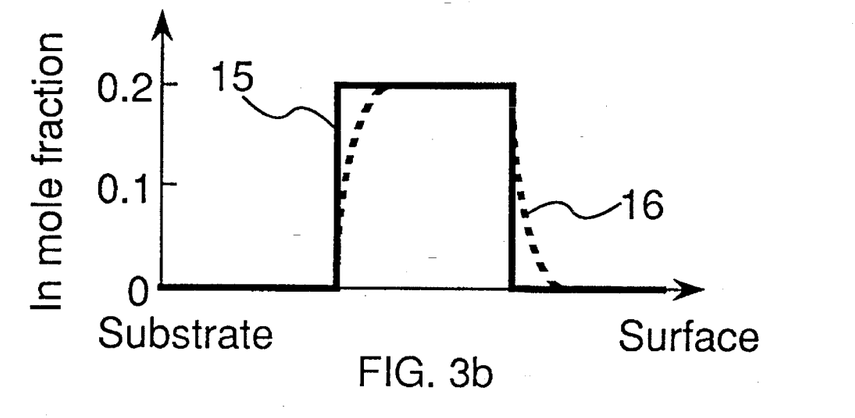

Next, a case of a semiconductor laser will be explained. As shown in FIG. 3a, in the case of a quantum well semiconductor laser having a quantum well structure consisting of GaAs barrier layers 11 and an InGaAs quantum well layer 12 (In mole fraction 0.2), the energy band diagram should be shown by solid lines 13 if it is as designed, as shown in FIG. 3a. Actually, however, it is gradual on the interfaces between the quantum well layer 12 and the barrier layers 11 on both sides thereof, like dashed lines 14. It is caused, as shown in FIG. 3b, in that the In distribution is not shown by the solid line 15 as designed, due to surface segregation of In, but is gradual on the interfaces between the quantum well layer 12 and the barrier layers 11 on both sides thereof like the dashed line 16. Since the amount of In becomes smaller than the designed value on the interface on the substrate side (the InGaAs quantum well layer 12 is laminated on the GaAs barrier layer 11) in this case, the energy band diagram becomes gradual so that the band gap become wider. On the other hand, since the amount of In becomes larger than the designed value on the interface on the surface side (the GaAs barrier layer 11 is stacked on the InGaAs quantum well layer 12), the energy band diagram becomes gradual so that the band gap become narrower. As a result, the shape of the energy band diagram in the quantum well does not become rectangular as designed, that is, the base is shorter than the designed one and the upper side is wider, so that the electron distribution in the quantum well is shifted upward. It means that the quantum level in the quantum well is shifted upward and the peak emission wave length is shifted to the shorter wave length side. Furthermore, since the In segregation ratio reacts sensitively to the growth conditions, particularly to the growth temperature, the reproducibility of peak emission wavelength and the horizontal fluctuation thereof in each wafer are bad.

Figure 8A:
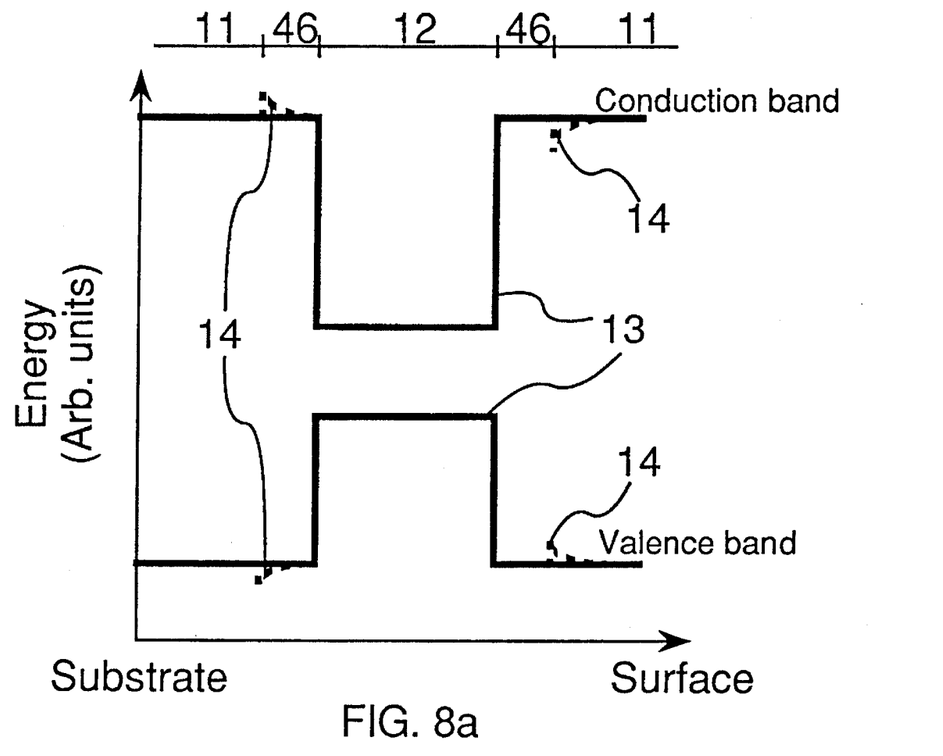
FIGS. 8a and 8b are drawings showing the energy band diagram of the quantum well structure of Embodiment 5 of the present invention and the In distribution respectively.
Figure 8B:
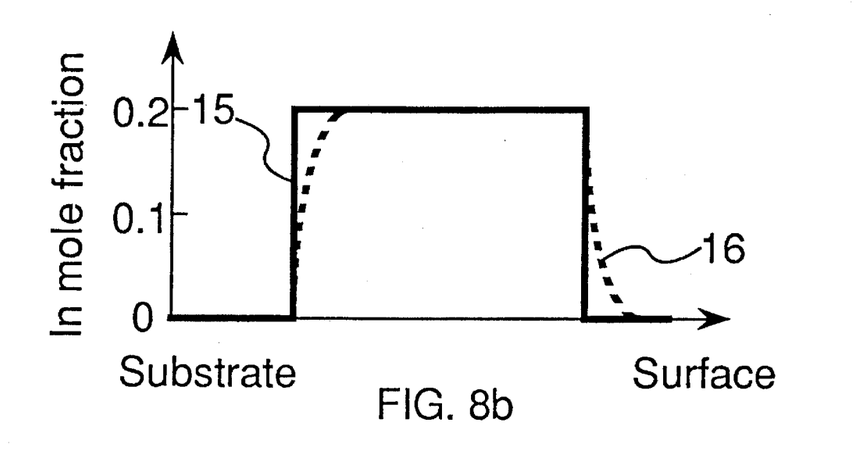

To solve these problems, according to the present invention, InAlGaAs layers 46 are inserted between the InGaAs quantum well layer 12 and the GaAs barrier layers 11 on both sides thereof as barrier layers as shown in FIGS. 8a and 8b.

Since In is contained also in the barriers 46, as shown in FIG. 8b, the In distribution 16 is not gradual on the interfaces between the InAlGaAs barrier layers 46 and the quantum well layer 12 and the gradualness is moved to the interfaces between the InAlGaAs barrier layers 46 and the next GaAs barrier layers 11. The effect of the surface segregation of In on the interfaces between the barriers and quantum well layer can be eliminated as mentioned above. Therefore, the interfaces between the barriers and the quantum well layer become abrupt.

As to the energy band diagram, as shown in FIG. 8a, the interfaces between the InAlGaAs barrier layers 46 and the GaAs barriers 11, where the In distribution 16 is gradual, are not shown by the solid lines 13 as designed but shown are by the dashed lines 14, though the interfaces between the InAlGaAs barrier layers 46 and the quantum well layer 12 are as designed (the symbol 13 is overlaid with the symbol 14).

Therefore, the peak emission wavelength of the quantum well structure is not affected by segregation of In, so that the reproducibility of peak emission wavelength and horizontal fluctuation thereof in each wafer are improved, and consequently the yield of semiconductor crystalline laminate structure and the device yield are improved.

FIGS. 8a and 8b shows an example where the InAlGaAs barrier layers 46 are installed on both sides of the quantum well layer 12. However, needless to say, when the InAlGaAs barrier layer is installed on only one side, a reasonable effect will be produced. As to the peak emission wavelength, the shape in the neighborhood of the base of the energy band diagram in the quantum well is deformed greater on the interface on the substrate side than on the interface on the surface side as shown in FIG. 3b. Therefore, when the InAlGaAs barrier layer 46 is to be installed only on one side, it is effective to install it on the substrate side.

The above explanation uses an example of surface segregation of In among InGaAs. A semiconductor which is apt to be surface-segregated is generally a semiconductor having a largest lattice constant among semiconductors constituting an alloyed semiconductor. In the case of InGaAs, InAs is a semiconductor having a largest lattice constant. Since As is an element common to each layer, it is handled as In in the above explanation for simplicity. Other typical examples of surface segregation are Ge in the Si/SiGe/Si hetero structure and Sb (In is common in this case) in the InAlAs/InAsSb/InP hetero structure.

DETAILED DESCRIPTION OF THE PREFERRED EMBODIMENTS

The embodiments of the present invention will be explained hereunder with reference to the accompanying drawings.

EMBODIMENT 1

A semiconductor crystalline laminate structure having a selectively doped hetero structure of Embodiment 1 of the present invention will be explained with reference to FIG. 1. On a semi-insulated GaAs substrate 1, an undoped GaAs layer 2 is grown in a thickness of 500 nm as a buffer layer, an undoped InGaAs layer 3 (In mole fraction 0.3) in a thickness of 6 nm as a channel layer, and the next layer of undoped AlGaAs as a conventional spacer layer using an MBE apparatus. According to this embodiment, an undoped InAlGaAs layer 4 (In mole fraction 0.3 and Al mole fraction 0.5) is grown in a thickness of 2 nm as a spacer layer and then an n-type AlGaAs carrier supply layer 5 (Al mole fraction 0.25, Si concentration $3 \times 10^{18}$ cm$^{-3}$) in a thickness of 20 nm, an undoped AlGaAs layer 6 (Al mole fraction 0.25) in a thickness of 7 nm, and an undoped GaAs cap layer 7 in a thickness of 5 nm are epitaxially grown sequentially.

When this crystal is evaluated by the hall measurement, the mobility of two-dimensional electron gases 8 formed on the undoped InGaAs layer 3 at room temperature is 7070 cm$^2$/V.s and the sheet carrier density is $2.4 \times 10^{12}$ cm$^{-2}$. On the other hand, when a crystal having a selectively doped hetero structure which uses an undoped AlGaAs layer 23 (Al mole fraction 0.25) in place of the InAlGaAs layer 4 as usual is also evaluated by the hall measurement, the mobility at room temperature is 6570 cm$^2$/V.s and the sheet carrier density is $2.4 \times 10^{12}$ cm$^{-2}$. The above evaluation shows that the mobility is improved by about 10% by this embodiment.

According to this embodiment, the yield of the semiconductor crystalline laminate structure when fluctuations of the mobility and sheet carrier density are within a range of 5% is about 90% which is about two times of the conventional value.

Furthermore, according to this embodiment, fluctuations of the mobility and sheet carrier density in the wafer are within a range of 2% which is about a half of the conventional value.

The above embodiment shows that the present invention is effective in improvement of the electric property and yield of a semiconductor crystalline laminate structure having the selectively doped hetero structure. The reason is as indicated below.

The mobility of two-dimensional electron gases in the selectively doped hetero structure generally depends on the quality of the interface between the spacer and channel greatly. In the case of hetero junction having the aforementioned structure, In segregated on the surface of the InGaAs layer 3 is fetched by the InAlGaAs layer 4. Since In is contained in this layer originally, the fetched In is further segregated and reaches within the n-type AlGaAs layer 5 as shown in FIG. 4b. As a result, the abruptness of the interface between the InAlGaAs spacer and InGaAs channel is decided only by the inter-diffusion ratio of Ga and Al. Since the inter-diffusion ratio of Ga and Al is very small such as several %, the obtained interface becomes very abrupt. Furthermore, the energy gap of the n-type AlGaAs layer 5 is slightly changed by In which is surface-segregated and fetched into the n-type AlGaAs layer 5. However, the effect is such that the ionization rate of Si donor is slightly changed and no problem is imposed in the channel property. The energy band diagram in the neighborhood of the channel layer of this embodiment is as shown in FIG. 4a and the interface between the spacer and channel is not affected by the surface segregation of In and becomes abrupt.

EMBODIMENT 2

A semiconductor crystalline laminate structure having a selectively doped hetero structure of Embodiment 2 of the present invention will be explained with reference to FIG. 5. Although the thickness of the InAlGaAs layer 4 in Embodiment 1 is 2 nm, the thickness is reduced to 1 nm and an undoped AlGaAs layer 23 with a thickness of 1 nm is inserted between the n-type AlGaAs layer 5 and the InAlGaAs layer 4 for the reduced thickness of the spacer layer so that the sum of the thickness of the undoped AlGaAs layer 23 and the thickness of the InAlGaAs layer 4 becomes 2 nm.

By doing this, the same result as that of Embodiment 1 is obtained. It indicates that the existence of the InAlGaAs layer 4 is important and the effect of the present invention will not be changed even if the thickness is changed depending on the object of the semiconductor crystalline laminate structure or device.

EMBODIMENT 3

A semiconductor crystalline laminate structure having a selectively doped hetero structure of Embodiment 3 of the present invention will be explained with reference to FIG. 6. To minimize the effect of reduction of the In mole fraction on the substrate side of the InGaAs channel layer 3 due to the surface segregation of In, a structure that an InAlGaAs layer 33 with a thickness of 2 nm (In mole fraction 0.3, Al mole fraction 0.25) is inserted between the InGaAs channel layer 3 and the GaAs buffer layer 2 in addition to the above InAlGaAs layer 4 is prepared.

As a result, the mobility is slightly reduced to 6820 $cm^2/V.s$ compared with that when the buffer is only the GaAs layer 2, though the sheet carrier density is increased to $2.51 \times 10^{12}$ $cm^{-2}$.

The above result shows that whether or not to insert the InAlGaAs layer 33 on the buffer side of the channel can be decided depending on which is important, greater mobility or higher sheet carrier density depending on the device specification.

In the above Embodiments 1 to 3, the mole fractions of In of the InGaAs channel layer 3 and the InAlGaAs spacer layer 4 are equal to each other so as to maximize the effect of the present invention. However, they may be changed as long as a property superior to the priority art can be obtained.

For comparison with the prior art, the spacer layer 4 is a quaternary mixed crystal (InAlGaAs) and the energy gap thereof is made equal to that of the conventional AlGaAs spacer 23 (shown in FIGS. 2a, 2b). However, the energy gap of the InAlGaAs spacer layer 4 can be designed freely without the effect of the present invention being changed by changing the ratio of Al to Ga as long as a property superior to the priority art can be obtained. Needless to say, even if the Ga mole fraction is 0 for example, the effect of the present invention will not be changed.

The total thickness of layers containing In is the critical thickness where no misfit dislocation occurs (hereinafter called critical thickness) or less. Needless to say, a thickness which is not beyond the critical thickness is desirable so as to obtain a good property. According to the critical thickness model by Matthews and others, the critical thickness when the In mole fraction is 0.3 is about 9 nm.

The growth temperature of layers containing In is 420° C. However, the reproducibility of mobility and sheet carrier density at 400° C. to 450° C. is very good.

Since a molecular beam epitaxy apparatus having two Ga Knudsen cells is used, there is no need to interrupt the growth on the interface between the spacer and channel. However, needless to say, even if the growth is interrupted on the interface between the spacer and channel when one Ga Knudsen cell is used, the effect of the present invention will not be changed.

The surface segregation of In among InGaAs on the GaAs substrate is described. However, the present invention may be applied to surface segregation of Ge to the Si layer during growth of the Si/SiGe crystal on the Si substrate. Needless to say, if a CSiGe (carbon, silicon, germanium) layer with a thickness of about 2 nm is inserted into the Si/SiGe interface, it is effective, and the same effect will be produced also on surface segregation of In in the AlSb/InGaSb/GaSb system and surface segregation of Sb in the InAlAs/InAsSb/InP system.

From the results obtained in Embodiments 1 to 3, it is obvious that by using the semiconductor crystalline laminate structure of the present invention, the transconductance, noise figure, and gain of a HEMT device or an MMIC (monolithic microwave integrated circuit) using it are improved and the yield thereof is improved.

The selectively doped hetero structure is used in the above embodiments. However, needless to say, even if the present invention is applied to a channel doped hetero structure or any other hetero structure, the same effect will be obtained.

EMBODIMENT 4

Figure 7:
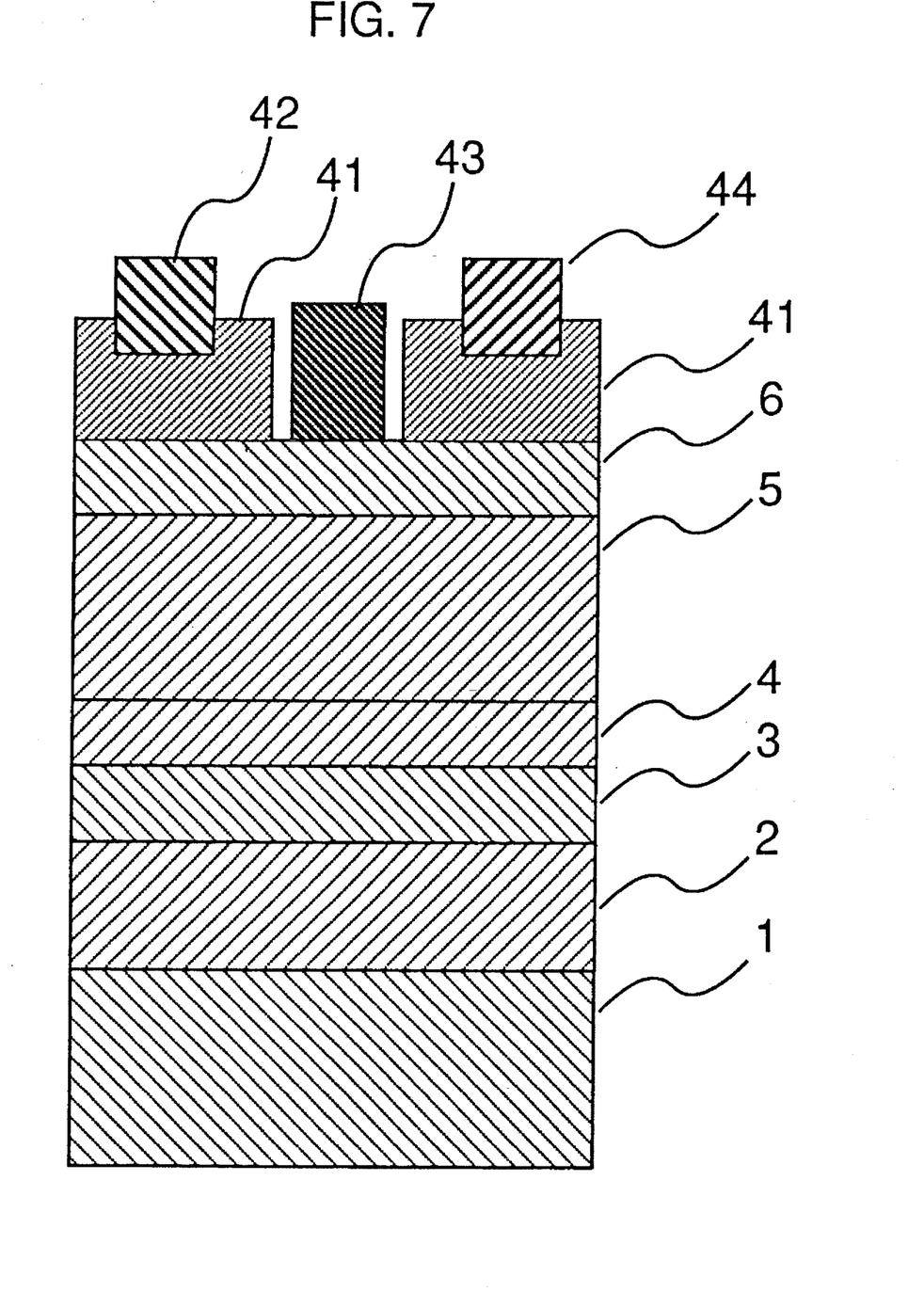
FIG. 7 is a cross sectional view of a HEMT of Embodiment 4 of the present invention.

A HEMT of Embodiment 4 of the present invention will be explained with reference to FIG. 7. Firstly, an undoped GaAs layer 2 in a thickness of 500 nm as a buffer layer, an undoped InGaAs layer 3 (In mole fraction 0.25) in a thickness of 6 nm as a channel layer, and then an undoped InAlGaAs spacer layer 4 (In mole fraction 0.25, Al mole fraction 0.45) in a thickness of 2 nm, an n-type AlGaAs layer 5 (Al mole fraction 0.25, Si density $3 \times 10^{18}$ $cm^{-3}$) in a thickness of 20 nm, an undoped AlGaAs layer 6 (Al mole fraction 0.25) in a thickness of 12 nm, and an n-type GaAs cap layer 41 (Si density $4 \times 10^{18}$ $cm^{-3}$) in a thickness of 160 nm, which are characteristics of the present invention, are epitaxially grown sequentially on a semi-insulated GaAs substrate 1 using the MBE apparatus.

From the semiconductor crystalline laminate structure which is formed like this, an HEMT device with a gate length of 0.15 μm and a gate width of 200 μm is prepared via the mesa etching process which is well known and the process for forming a source electrode 42, a gate electrode 43, and a drain electrode 44.

The mobility obtained from the HEMT device formed like this is 6790 $cm^2/V.s$ which is higher than the mobility of 6000 $cm^2/Vs$ of the HEMT device which uses the undoped AlGaAs spacer layer 23 (Al mole fraction 0.25) in place of the InAlGaAs spacer layer 4 as usual by about 10%.

The transconductance of the device is 35 mS per a gate width of 200 μm at an operating current of 2 mA, which is improved by about 10% compared with the conventional value. The maximum transconductance is 115 mS per a gate width of 200 μm, which is improved by about 15% compared with the conventional value.

The yield of the semiconductor crystalline laminate structure when fluctuations from the designed value of threshold voltage are within a range of 30 mV is about 80%, which is about 2 times that of the conventional value.

When a device, of a structure having an InAlGaAs layer (In mole fraction 0.25, Al mole fraction 0.2) inserted in a depth of 2 nm, between the InGaAs channel layer 3 and the GaAs buffer layer 2 is manufactured by way of trial, the transconductance is 35 mS per a gate width of 200 μm at an operating current of 2 mA, which is improved by about 10% compared with the conventional value. The maximum transconductance is 120 mS per a gate width of 200 μm, which is improved by about 20% compared with the conventional value.

This embodiment shows that the present invention is effective in improvement of the performance and yield of HEMT devices.

In this embodiment, the mole fractions of In of the InGaAs channel layer 3 and the InAlGaAs spacer layer 4 are equal to each other so as to maximize the effect of the present invention. However, they may be changed as long as a property superior to the prior art can be obtained.

For comparison with the prior art, the spacer layer 4 is a quaternary mixed crystal (InAlGaAs) and the energy gap thereof is made equal to that of the conventional AlGaAs spacer 23 (shown in FIGS. 2a, 2b). However, the energy gap of the InAlGaAs spacer layer 4 can be designed freely without the effect of the present invention being changed by changing the ratio of Al to Ga as long as a property superior to the prior art can be obtained. Needless to say, even if the Ga mole fraction is 0 for example, the effect of the present invention will not be changed.

The thickness of the InAlGaAs layer 4 is 2 nm. In this case, however, it is important that the InAlGaAs spacer layer 4 exists in contact with the InGaAs channel layer 3, and even if the thickness may be changed depending on the object of the crystal or device, the effect will not be changed. In addition, even when the undoped AlGaAs layer is inserted between the InAlGaAs layer 4 and the n-type AlGaAs layer 5, the effect of the present invention will not be changed.

The total thickness of layers containing In is the critical thickness or less. Needless to say, a thickness which is not beyond the critical thickness is desirable so as to obtain a good property. According to the critical thickness model by Matthews and others, the critical thickness when the In mole fraction is 0.25 is about 12 nm.

The growth temperature of layers containing In is 420° C. However, the reproducibility of threshold voltage at 400° C. to 450° C. is very good.

Judging from the transconductance obtained in this embodiment, it is obvious that a superior property can be obtained by using a HEMT of the same structure as an amplifier with low power consumption and low noise. Furthermore, since the yield is extremely improved, the structure is advantageous in forming ICs.

Only the HEMT device is described in this embodiment. However, the present invention is also effective in another device using a semiconductor crystalline laminate structure by epitaxial growth, for example, an HIGFET (heterostructure insulated gate field effect transistor).

EMBODIMENT 5

The quantum well structure of Embodiment 5 of the present invention will be explained with reference to FIGS. 8a, 8b. A structure having InAlGaAs barrier layers 46 (In mole fraction 0.2, Al mole fraction 0.15) with a thickness of 2 nm, which is a characteristic of the present invention, inserted between an InGaAs quantum well layer 12 (In mole fraction 0.2) with a thickness of 15 nm and GaAs barrier layers 11 with a thickness of 200 nm on both sides thereof, is prepared by the MBE method. In this case, two types of samples when the growth temperature is 400° C. and 450° C. are prepared.

As comparison examples, two types of samples without InAlGaAs barrier layers 46 inserted, when the growth temperature is 400° C. and 450° C., are prepared.

When these 4 types of samples are subjected to photoluminescence measurement at 77K, the samples wherein the InAlGaAs barrier layers 46 are inserted show that the peak emission wavelength is constant at 970 nm regardless of the growth temperature. On the other hand, the samples wherein no InAlGaAs barrier layers 46 are inserted are changed with the growth temperature, such that the peak emission wavelength is 965 nm at a growth temperature of 400° C. and the peak emission wavelength is 955 nm at a growth temperature of 450° C.

From the above results, it is obvious that since the peak emission wavelength of the samples wherein the InAlGaAs barrier layers 46 are inserted is constant regardless of the growth temperature, by applying the present invention the device can be improved substantially.

In this embodiment, the mole fractions of In of the InGaAs quantum well layer 12 and the InAlGaAs barrier layers 46 are equal to each other so as to maximize the effect of the present invention. However, they may be changed as long as a stable peak emission wavelength is obtained at a growth temperature between 400° C. and 450° C.

For comparison with the prior art, the barrier layers 46 are quaternary mixed crystals (InAlGaAs) and the mole fractions of Al and Ga are set so that the energy gap thereof is made equal to that when only the conventional GaAs barrier layer 11 is used. However, the effect of the present invention will not be changed when the Al mole fraction is not 0 and the mole fractions of Al and Ga can be freely set by a designer.

The total thickness of layers containing In is the critical thickness or less. Needless to say, a thickness which is not beyond the critical thickness is desirable so as to obtain a good property. According to the critical thickness model by Matthews and others, the critical thickness when the In mole fraction is 0.2 is about 20 nm.

Only the quantum well structure of the InGaAs/GaAs system is described in this embodiment. However, even if the present invention is applied to the strained quantum well structure of another material system, the same effect is obtained. For example, the InAlGaAs barrier layer is effective in the InGaAs/AlGaAs system and the InAlGaAsP barrier layer is effective in the InGaAsP/InP system.

EMBODIMENT 6

Figure 9:
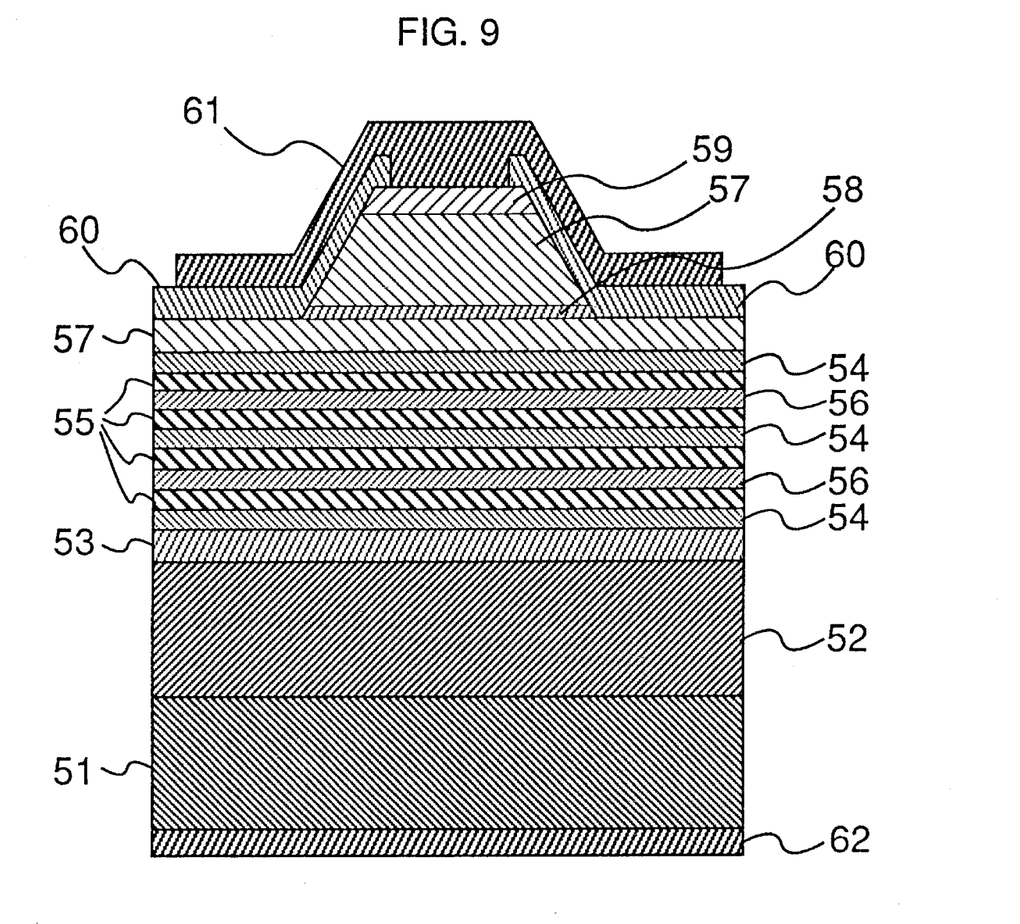
FIG. 9 is a cross sectional view of a quantum well semiconductor laser of Embodiment 6 of the present invention.

The quantum well semiconductor laser of Embodiment 6 of the present invention will be explained with reference to FIG. 9. On an n-type GaAs substrate 51, an n-type InGaP cladding layer 52 which is lattice-matched with GaAs, an InGaAsP waveguide layer 53 in a thickness of 800 nm (wave length from the energy gap 704 nm) which is lattice-matched with GaAs, a barrier layer consisting of a GaAs layer 54 in a thickness of 9 nm and an InAlGaAs layer 55 (In mole fraction 0.15, Al mole fraction 0.1) of the present invention in a thickness of 1 nm, an InGaAs strained quantum well layer 56 (In mole fraction 0.15) in a thickness of 7 nm, an InAlGaAs layer 55 in a thickness of 1 nm, a GaAs layer 54 in a thickness of 8 nm, an InAlGaAs layer 55 in a thickness of 1 nm, an InGaAs strained quantum well layer 56 in a thickness of 7 nm, an InAlGaAs layer 55 in a thickness of 1 nm, a GaAs layer 54 in a thickness of 9 nm, a p-type InGaP cladding layer 57 which is lattice-matched with GaAs, a p-type GaAs optical waveguide layer 58, a p-type InGaP cladding layer 57, and a p-type GaAs cap layer 59 are formed sequentially by the MOCVD method. Thereafter, a ridge with a width of 1 to 15 µm is formed by the normal photo-etching method. Next, an oxide layer 60 is formed, and only the upper part of the ridge is removed, and an electrode 61 on the p side and an electrode 62 on the n side are formed. Thereafter, a laser element with a length of 450 μm is obtained by the cleavage method. Thereafter, a low reflection layer with a thickness of λ/4 (λ: emission wave length) which is an oxide layer is formed on the front of the element and a high reflection layer consisting of 4 layers of oxide layers and α-Si is formed on the back of the element.

As a comparison example, a device of the conventional type using no InAlGaAs layer 55 is prepared.

As a result, the trial device has good reproducibility at a stripe width of 3 μm and a threshold current of about 10 mA and operates continuously at room temperature. On the other hand, in the device of the conventional type using no InAlGaAs layer 55, the threshold current varies between about 15 mA and 40 mA. The peak emission wave length of the trial device is 980 nm and the yield when variances are within 5% is about 90% which is about 1.8 times of the conventional value. This device operates stably up to 400 mW and the full angle at half maximum in the direction perpendicular to the junction is 35°. When the device is continuously operated at a constant optical output of 100 mW under the condition of an environment temperature of 60° C., a stable operation characteristic can be obtained even after 10000 hours.

An element wherein the InAlGaAs layer 55 is replaced with an InAlAs layer is prepared and the same experiment is made. The threshold current is reduced to less than 12 mA and the peak emission wave length varies slightly. The result shows that it is important that In is contained in the barrier layer. In this case, the experiment is made under an ideal condition that the In mole fractions of the barrier layer and quantum well layer are equal to each other. However, the In mole fractions may be changed as long as a prior superior to the priority art can be obtained.

The total thickness of layers containing In is the critical thickness or less in this embodiment. Needless to say, a thickness which is not beyond the critical thickness is desirable so as to obtain a good property. According to the critical thickness model by Matthews and others, the critical thickness when the In mole fraction is 0.15 is about 30 nm.

Only the quantum well structure of the GaAs/InGaAs system is described in this embodiment. However, even if the present invention is applied to the strained quantum well laser of another material system, for example, an InGaAsP/InP system, the same effect is obtained.

By using the present invention, gradualness of the hereto interface due to surface segregation of a large lattice constant semiconductor constituting an alloyed semiconductor or an element constituting the large lattice constant semiconductor, for example, Ge or In can be eliminated, so that it is greatly effective in high performance of electronic or optical devices.

What is claimed is:

1. A semiconductor crystalline laminate structure comprising a first semiconductor layer consisting of a first alloyed semiconductor, a second semiconductor layer which has an energy gap wider than that of said first alloyed semiconductor and a lattice constant smaller than that of said first alloyed semiconductor and consists of one semiconductor selected from a group consisting of single-element semiconductor, compound semiconductor, and alloyed semiconductor, and a third semiconductor layer which consists of a second alloyed semiconductor having an energy gap wider than that of said first alloyed semiconductor and is formed between said first semiconductor layer and said second semiconductor layer and in contact with each of them, wherein a semiconductor having a largest lattice constant among semiconductors constituting said first alloyed semiconductor is included only in said first semiconductor layer and said third semiconductor layer among said first, second, and third semiconductor layers, and is a semiconductor containing In as a constituent element, and the In mole fraction of said third semiconductor layer is within a range from 0.15 to 0.3, so as to prevent segregation of In from the first semiconductor layer into the second semiconductor layer.

2. A semiconductor crystalline laminate structure according to claim 1, wherein said first semiconductor layer is an InGaAs layer, and said second semiconductor layer is an AlGaAs layer (Al mole fraction 0 included), and said third semiconductor layer is an InAlGaAs layer (Ga mole fraction 0 included).

3. A semiconductor device having a semiconductor crystalline laminate structure comprising a first semiconductor layer consisting of a first alloyed semiconductor, a second semiconductor layer which has an energy gap wider than that of said first alloyed semiconductor and a lattice constant smaller than that of said first alloyed semiconductor and consists of one semiconductor selected from a group consisting of single-element semiconductor, compound semiconductor, and alloyed semiconductor, and a third semiconductor layer which consists of a second alloyed semiconductor having an energy gap wider than that of said first alloyed semiconductor and is formed between said first semiconductor layer and said second semiconductor layer and in contact with each of them, wherein a semiconductor having a largest lattice constant among semiconductors constituting said first alloyed semiconductor is included only in said first semiconductor layer and said third semiconductor layer among said first, second, and third semiconductor layers, wherein said semiconductor having a largest lattice constant is a semiconductor containing In as a constituent element, wherein the In mole fraction of said third semiconductor layer is within a range from 0.15 to 0.3, and wherein said semiconductor device is an HEMT, said first semiconductor layer is a channel, said second semiconductor layer is a carrier supply layer, and said third semiconductor layer is a spacer, said device further comprising a gate electrode overlying said channel, and source and drain electrodes respectively at opposite sides of the gate electrode.

4. A semiconductor device having a semiconductor crystalline laminate structure comprising a first semiconductor layer consisting of a first alloyed semiconductor, a second semiconductor layer which has an energy gap wider than that of said first alloyed semiconductor and a lattice constant smaller than that of said first alloyed semiconductor and consists of one semiconductor selected from a group consisting of single-element semiconductor, compound semiconductor, and alloyed semiconductor, and a third semiconductor layer which consists of a second alloyed semiconductor having an energy gap wider than that of said first alloyed semiconductor and is formed between said first semiconductor layer and said second semiconductor layer and in contact with each of them, wherein a semiconductor having a largest lattice constant among semiconductors constituting said first alloyed semiconductor is included only in said first semiconductor layer and said third semiconductor layer among said first, second, and third semiconductor layers, wherein said semiconductor having a largest lattice constant is a semiconductor containing In as a constituent element, wherein the In mole fraction of said third semiconductor layer is within a range from 0.15 to 0.3, and wherein said semiconductor device is a quantum well semiconductor laser having a quantum well consisting of a well layer and a barrier layer as active layers, said first semiconductor layer is said well layer, and said second semiconductor layer and said third semiconductor layer are said barrier layers, said quantum well semiconductor laser further comprising a first electrode and a second electrode respectively at opposed sides of the quantum well, so as to cause light emission from the active layers.

5. A semiconductor device according to claim 3, wherein said first semiconductor layer is an InGaAs layer, said second semiconductor layer is an AlGaAs layer (Al mole fraction 0 included), and said third semiconductor layer is an InAlGaAs layer (Ga mole fraction 0 included).

6. A semiconductor device according to claim 4, wherein said first semiconductor layer is an InGaAs layer, said second semiconductor layer is an AlGaAs layer (Al mole fraction 0 included), and said third semiconductor layer is an InAlGaAs layer (Ga mole fraction 0 included).

7. A semiconductor device according to claim 4, wherein the device further includes cladding layers respectively at opposed sides of the quantum well, interposed between the quantum well and the first electrode, and between the quantum well and the second electrode.

8. A semiconductor device according to claim 7, wherein the device further includes optical waveguide layers respectively at opposed sides of the quantum well, interposed between the quantum well and respective cladding layers.

9. A semiconductor device having a semiconductor crystalline laminate structure comprising a first semiconductor layer consisting of a first alloyed semiconductor, a second semiconductor layer which has an energy gap wider than that of said first alloyed semiconductor and a lattice constant smaller than that of said first alloyed semiconductor and consists of one semiconductor selected from a group consisting of single-element semiconductor, compound semiconductor, and alloyed semiconductor, and a third semiconductor layer which consists of a second alloyed semiconductor having an energy gap wider than that of said first alloyed semiconductor and is formed between said first semiconductor layer and said second semiconductor layer and in contact with each of them, wherein a semiconductor having a largest lattice constant among semiconductors constituting said first alloyed semiconductor is included only in said first semiconductor layer and said third semiconductor layer among said first, second, and third semiconductor layers, wherein said semiconductor having a largest lattice constant is a semiconductor containing In as a constituent element, wherein the In mole fraction of said third semiconductor layer is within a range from 0.15 to 0.3, wherein said semiconductor device is an FET, and wherein said first semiconductor layer is a channel of said FET.

10. A semiconductor device according to claim 9, wherein said first semiconductor layer is an InGaAs layer, said second semiconductor layer is an AlGaAs layer (Al mole fraction 0 included), and said third semiconductor layer is an InAlGaAs layer (Ga mole fraction 0 included).

* * * * *